United States Patent
Prandi et al.

(10) Patent No.: US 7,616,078 B2
(45) Date of Patent: Nov. 10, 2009

(54) DEVICE FOR CONTROLLING THE FREQUENCY OF RESONANCE OF AN OSCILLATING MICRO-ELECTROMECHANICAL SYSTEM

(75) Inventors: Luciano Prandi, Bellinzago Novarese (IT); Ernesto Lasalandra, San Donato Milanese (IT); Tommaso Ungaretti, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/864,424

(22) Filed: Sep. 28, 2007

(65) Prior Publication Data

US 2008/0106351 A1   May 8, 2008

Related U.S. Application Data

(63) Continuation of application No. PCT/EP2006/061118, filed on Mar. 28, 2006.

(30) Foreign Application Priority Data

Mar. 31, 2005   (EP)   ................................. 05425185

(51) Int. Cl.
  *H03H 9/125*   (2006.01)
  *H03H 9/52*   (2006.01)
  *H03H 3/013*   (2006.01)
(52) U.S. Cl. ..................... 333/186; 333/188
(58) Field of Classification Search ................ 333/186, 333/188, 200
See application file for complete search history.

(56) References Cited

U.S. PATENT DOCUMENTS 4,744,249 A * 5/1988 Stewart .................. 73/504.04
5,205,171 A * 4/1993 O'Brien et al. .......... 73/514.18

(Continued)

FOREIGN PATENT DOCUMENTS

EP   1278068 A2   1/2003

(Continued)

OTHER PUBLICATIONS

Gola et al.; "Interface for MEMS-Based Rotational Accelerometer for HDD Applications With 2.5 rad/s2 Resolution and Digital Output"; IEEE Sensors Journal; vol. 3, No. 4, Aug. 2003, pp. 383-392.*

(Continued)

*Primary Examiner*—Barbara Summons
(74) *Attorney, Agent, or Firm*—Lisa K. Jorgenson; Karl L. Klassen; Seed IP Law Group PLLC

(57) ABSTRACT

A device for controlling the frequency of resonance of an oscillating micro-electromechanical system includes: a microstructure, having a first body and a second body, which is capacitively coupled to the first body and elastically oscillatable with respect thereto at a calibratable frequency of resonance, a relative displacement between the second body and the first body being detectable from outside; and an amplifier coupled to the microstructure for detecting the relative displacement. DC decoupling elements are arranged between the amplifier and the microstructure.

28 Claims, 3 Drawing Sheets

U.S. PATENT DOCUMENTS

| | | | | |
|---|---|---|---|---|
| 5,530,342 | A * | 6/1996 | Murphy | 324/158.1 |
| 5,640,133 | A * | 6/1997 | MacDonald et al. | 333/197 |
| 5,744,968 | A * | 4/1998 | Czarnocki et al. | 324/608 |
| 5,955,932 | A * | 9/1999 | Nguyen et al. | 333/186 |
| 6,253,612 | B1 * | 7/2001 | Lemkin et al. | 73/504.02 |
| 6,624,726 | B2 * | 9/2003 | Niu et al. | 333/197 |
| 6,966,225 | B1 * | 11/2005 | Mallary | 73/514.32 |
| 7,348,867 | B2 * | 3/2008 | Hattori | 333/186 |
| 2003/0052699 | A1 * | 3/2003 | Lasalandra et al. | 324/662 |
| 2006/0071578 | A1 * | 4/2006 | Drabe et al. | 310/309 |

FOREIGN PATENT DOCUMENTS

JP 2004-112378 * 4/2004

OTHER PUBLICATIONS

Baschirotto et al.; "A Plus or Minus 1-g Dual-Axis Linear Accelerometer in a Standard 0.5 micrometer CMOS Technology for High-Sensitivity Applications"; IEEE Journal of Solid-State Circuits; vol. 38, No. 7, Jul. 2003, pp. 1292-1297.*

* cited by examiner

DEVICE FOR CONTROLLING THE FREQUENCY OF RESONANCE OF AN OSCILLATING MICRO-ELECTROMECHANICAL SYSTEM

CROSS-REFERENCE TO RELATED APPLICATION

This application is a continuation of International Application No. PCT/EP2006/061118, filed Mar. 28, 2006, and claims priority from European Patent Application No. 05425185, filed Mar. 31, 2005, which applications are incorporated herein by reference in their entirety.

BACKGROUND

1. Technical Field

The present invention relates to a device for controlling the frequency of resonance of an oscillating micro-electromechanical system.

2. Description of the Related Art

Various types of oscillating micro-electromechanical systems (MEMS) are known, which include a micro-electromechanical structure and a reading and driving circuit associated thereto. The micro-electromechanical structure comprises a fixed body or stator and a movable body constrained to the stator by elastic connection elements, in accordance with a mass-spring-damper model. In particular, the connection elements are configured so as to enable small oscillations of the movable body about a position of equilibrium selectively with respect to pre-determined degrees of freedom. The oscillating motion of the movable body with respect to the stator is characterized by a natural frequency of resonance that depends both upon the elastic constant of the connection elements and upon the mass of the movable body itself.

Furthermore, the movable body and the stator are capacitively coupled by means of a plurality of respective comb-fingered electrodes. The relative position of the movable body with respect to the stator determines the total coupling capacitance between the electrodes. Consequently, the total coupling capacitance between the electrodes can be measured by the reading and driving circuit to arrive at the relative position of the movable body with respect to the stator and hence to the force acting on the movable body itself. Vice versa, the reading and driving circuit can apply a controlled electrostatic force between the stator and the movable body by appropriately biasing the electrodes.

Application of a constant electrostatic force determines a non-zero mean displacement of the movable body with respect to the position of equilibrium and has the same effect of a (fictitious) elastic constant that is added to the elastic constant of the connection elements between the movable body and the stator. In practice, also the natural frequency of resonance of the mass-spring-damper system can be modified.

This possibility is very important in the fabrication of micro-electromechanical devices such as MEMS resonators or gyroscopes, in which the value of the natural frequency of resonance has a decisive role. In fact, since said value can be calibrated on the finished device instead of during its fabrication, the processes of fabrication are extremely less critical and hence simpler.

The reading and driving circuits include, among other things, a differential amplifier, which detects capacitive variations at the electrodes of the stator and supply a feedback quantity, typically a voltage. The feedback voltage generates an electrostatic force between the stator and the movable body.

A limit of the current reading and driving circuits lies in the fact that the dynamics available for calibration of the frequency of resonance is rather limited. In particular, the electrodes of the stator remain permanently coupled to the inputs of the differential amplifier, which must, however, be biased at a value of common-mode voltage (normally, the common-mode voltage is central with respect to the available maximum and minimum supply voltages). The voltages on the inputs of the differential amplifier must not depart significantly from the common-mode voltage in order to prevent saturation of the differential amplifier. Consequently, also the voltages that can be supplied to the electrodes of the stator to modify the elastic constant and the natural frequency of resonance of the MEMS can exploit only a limited part of the maximum available dynamics. In other words, the frequency of resonance of the MEMS can be calibrated only within of a small range of values.

BRIEF SUMMARY

The aim of the present invention is to provide a device for controlling the frequency of resonance of an oscillating micro-electromechanical system which will be free from the drawbacks described above.

According to the present invention, a device for controlling the frequency of resonance of an oscillating micro-electromechanical system is provided, as defined in Claim 1.

BRIEF DESCRIPTION OF THE SEVERAL VIEWS OF THE DRAWINGS

For a better understanding of the invention, there is now described an embodiment, purely by way of non-limiting example and with reference to the attached drawings, wherein.

DETAILED DESCRIPTION

In the ensuing description, reference will be made to the use of the invention in an electromechanical resonator. This must not, however, be considered as in any way limiting the sphere of application in so far as the invention can advantageously be applied also to oscillating micro-electromechanical systems of a different type, such as for example MEMS gyroscopes, and in any case to all micro-electromechanical structures of which it is necessary to control the natural frequency of oscillation.

Figure 1:
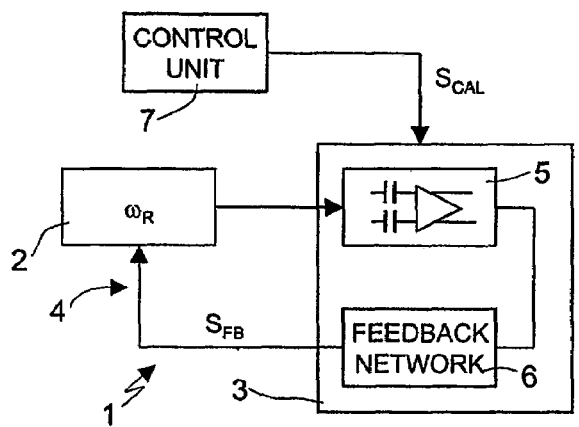
FIG. 1 illustrates a simplified block diagram of a microelectromechanical resonator incorporating a device for controlling the frequency of resonance according to the present invention.

FIG. 1 illustrates a micro-electromechanical resonator 1, comprising a micro-electromechanical structure 2 (hereinafter referred to as microstructure 2, for simplicity) and a reading and driving circuit 3 associated and connected thereto so as to form a feedback loop 4. The micro-electromechanical resonator 1 has a natural frequency of resonance (OR determined by the mechanical characteristics of the microstructure 2, as clarified hereinafter. The reading and driving circuit 3 maintains the microstructure 2 in vibration at a controlled frequency and forms, with the microstructure 2 itself, a device for controlling the frequency of resonance of the micro-electromechanical resonator 1.

The reading and driving circuit 3 includes a differential stage 5 and a feedback stage 6. The feedback stage 6, in itself known, is for example based upon a variable-gain amplifier (VGA), typically a voltage-controlled one, and sets conditions of oscillation as regards magnitude and phase on the feedback loop 4 according to the Barkhausen criterion. In particular, the condition of oscillation is guaranteed by a square-wave feedback signal $S_{FB}$ of controlled amplitude and phase. The micro-electromechanical resonator 1 is connected to a control unit 7, which supplies a calibration signal $S_{CAL}$ for calibration of the frequency of resonance of the micro-electromechanical resonator 1.

Figure 2:
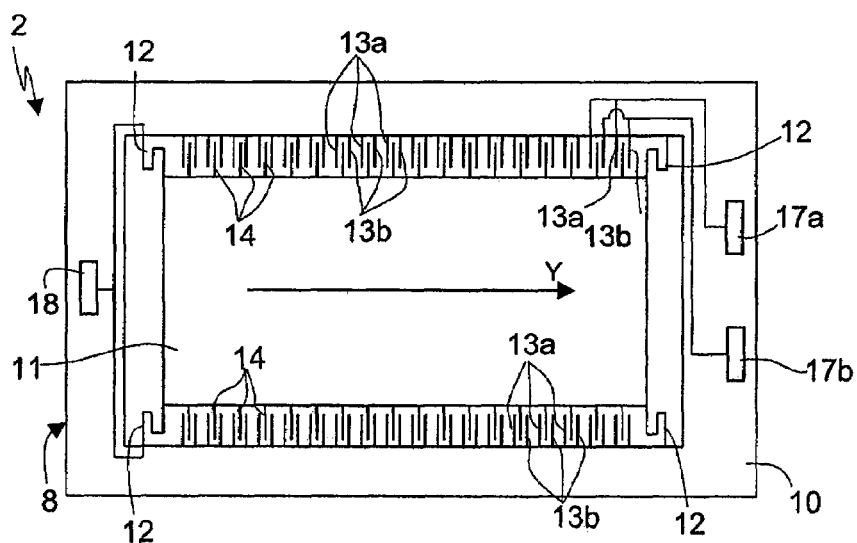
FIG. 2 is a schematic top plan view of a microstructure included in the system of FIG. 1.
Figure 3:
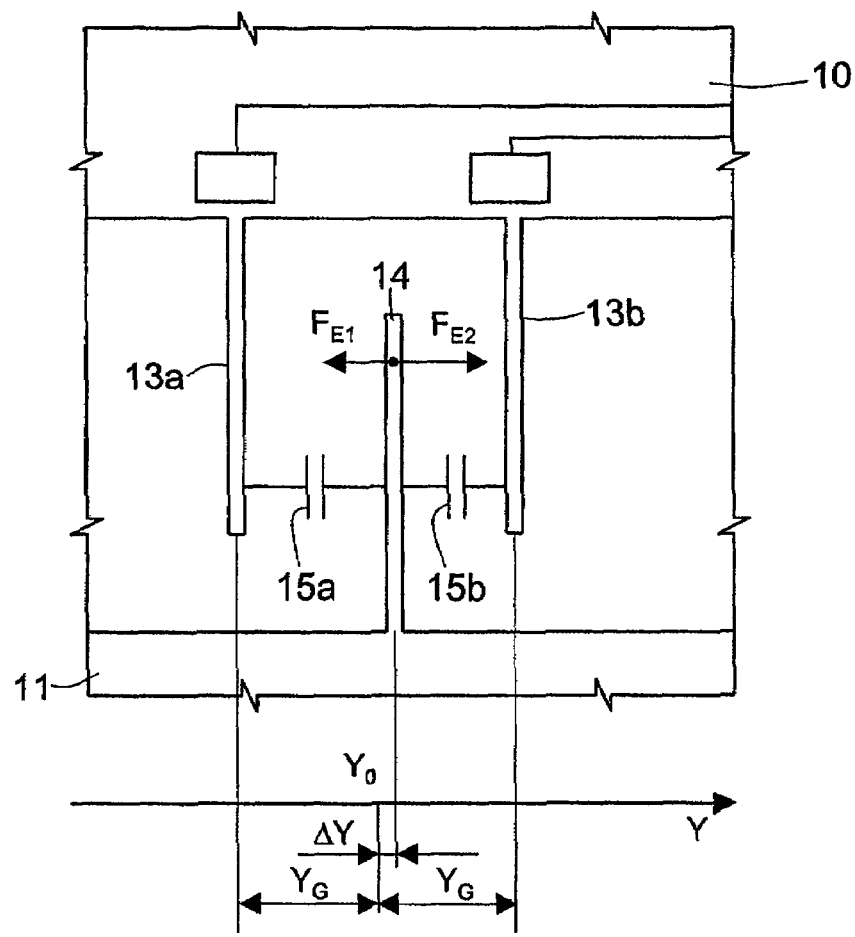
FIG. 3 shows a detail of the microstructure illustrated in FIG. 2 at an enlarged scale.

As shown in detail in FIGS. 2 and 3, the microstructure 2 is integrated in a semiconductor chip 8 and comprises a fixed portion or stator 10 and a movable body 11. The movable body 11 is constrained to the stator 10 by springs 12, which are also made of semiconductor material and are configured so that the movable body 11 may oscillate along an axis Y about an equilibrium position, designated by $Y_0$ in FIG. 3.

The stator 10 and the movable body 11 are capacitively coupled. In greater detail (FIG. 3), the stator 10 is provided with a plurality of first fixed electrodes 13a and a plurality of second fixed electrodes 13b, insulated from one another, whilst the movable body 11 is provided with a plurality of movable electrodes 14. The first and second fixed electrodes 13a, 13b and the movable electrodes 14 are all shaped as plane semiconductor plates extending perpendicular to the axis Y and are comb-fingered. More precisely, the stator 10 and the movable body 11 are arranged so that each movable electrode 14 faces, on one side, a respective fixed electrode 13a and, on the opposite side, a respective second fixed electrode 13b, thus forming a first capacitor 15a and a second capacitor 15b, respectively. Furthermore, the first fixed electrodes 13a are electrically connected in parallel to a first stator terminal 17a, and the second fixed electrodes 13b are connected in parallel to a second stator terminal 17b. The movable electrodes 14 are connected to a common terminal 18 through the movable body 11 and the springs 12, all of which are made of semiconductor material.

The movable body 11 can oscillate about the equilibrium position $Y_0$ with a motion characterized by the natural frequency of resonance $\omega_R$ given by:

$$\omega_R = \sqrt{K_M/M} \quad (1)$$

where $K_M$ is the (mechanical) elastic constant associated to the springs 12, and M is the mass of the movable body 11.

When the movable body 11 has a displacement $\Delta Y$ with respect to the equilibrium position $Y_0$ and, moreover, the first and second fixed electrodes 13a, 13b are biased with a same shift voltage Vs with respect to the movable electrodes 14, each movable electrode 14 is subjected to two opposite electrostatic forces $F_{E1}$, $F_{E2}$ along the axis Y (see FIG. 3), which are given by:

$$F_{E1} = \frac{1}{2}\frac{C_{NOM}Y_G^2V_S^2}{Y_G(Y_G - \Delta Y)^2} \quad (2)$$

$$F_{E2} = -\frac{1}{2}\frac{C_{NOM}Y_G^2V_S^2}{Y_G(Y_G - \Delta Y)^2}$$

In Equations (2), $Y_G$ is the distance between each movable electrode 14 and the first and second fixed electrodes 13a, 13b adjacent thereto, when the movable body 11 is in the equilibrium position $Y_0$, and $C_{NOM}$ is the capacitance of the capacitors 15a, 15b, once again with the movable body 11 in the equilibrium position $Y_0$. The resultant electrostatic force $F_{ER}$ applied to each movable electrode 14 is:

$$F_{ER} = F_{E1} + F_{E2} = \frac{2C_{NOM}(\Delta Y/Y_G)V_S^2}{Y_G(1-(\Delta Y/Y_G)^2)^2} \quad (3)$$

and, on the hypothesis of small displacements ($Y_G << \Delta Y$):

$$F_{ER} = \frac{2C_{NOM}(\Delta Y - Y_G)V_S^2}{Y_G^2} \quad (3)$$

Equation (4) shows a direct proportionality between the resultant electrostatic force $F_{ER}$ and the displacement $\Delta Y$. The effect of the resultant electrostatic force $F_{ER}$ is equivalent to that of a fictitious elastic force with negative elastic constant. It is hence possible to introduce an electrostatic elastic constant $K_E$ given by:

$$K_E = -\frac{dF_{ER}}{dY} = -\frac{2C_{NOM}V_S^2}{Y_G^2} \quad (5)$$

As may be noted from Equation (5), the electrostatic elastic constant $K_E$ is correlated to the shift voltage $V_S$. Consequently, when the fixed electrodes 13a, 13b are biased at the shift voltage $V_S$ with respect to the movable electrodes 14, the motion of the movable body is characterized by an equivalent elastic constant $K_{EQ}$ and by a translated frequency of resonance $\omega_{RS}$ given by:

$$K_{EQ} = K_M + K_E \quad (6)$$

$$\omega_{RS} = \sqrt{K_{EQ}/M} \quad (7)$$

Figure 5:
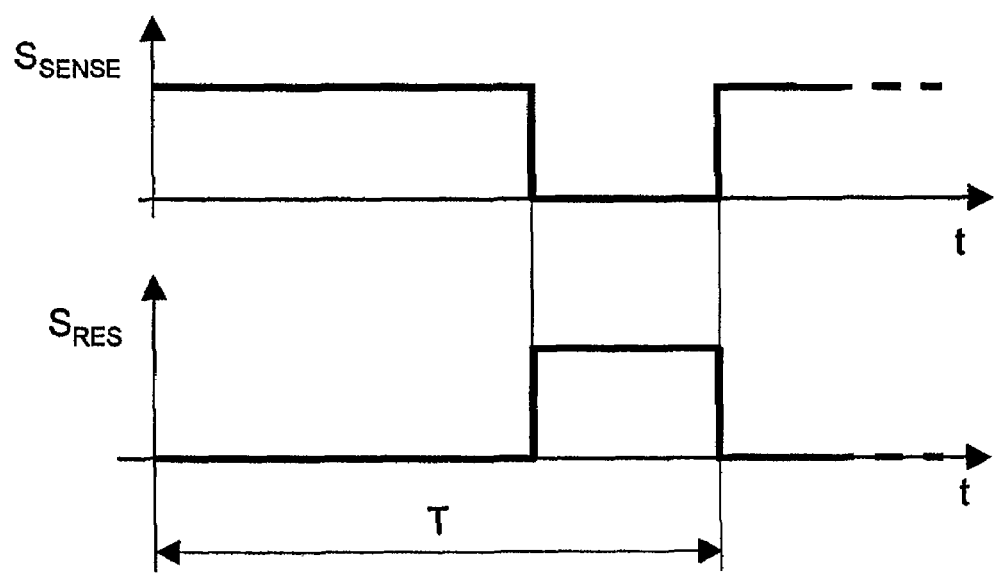
FIG. 5 is a graph showing plots of quantities regarding the device illustrated in FIG. 4.
Figure 4A:
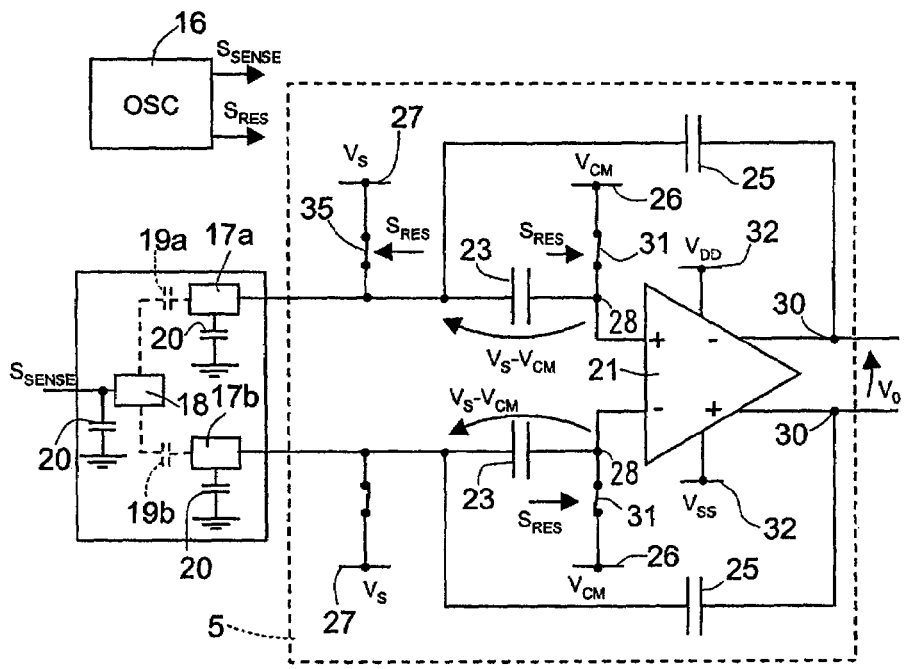
FIGS. 4a and 4b are simplified circuit diagrams of the device for controlling the frequency of resonance incorporated in the system of FIG. 1, in two different operating configurations.
Figure 4B:
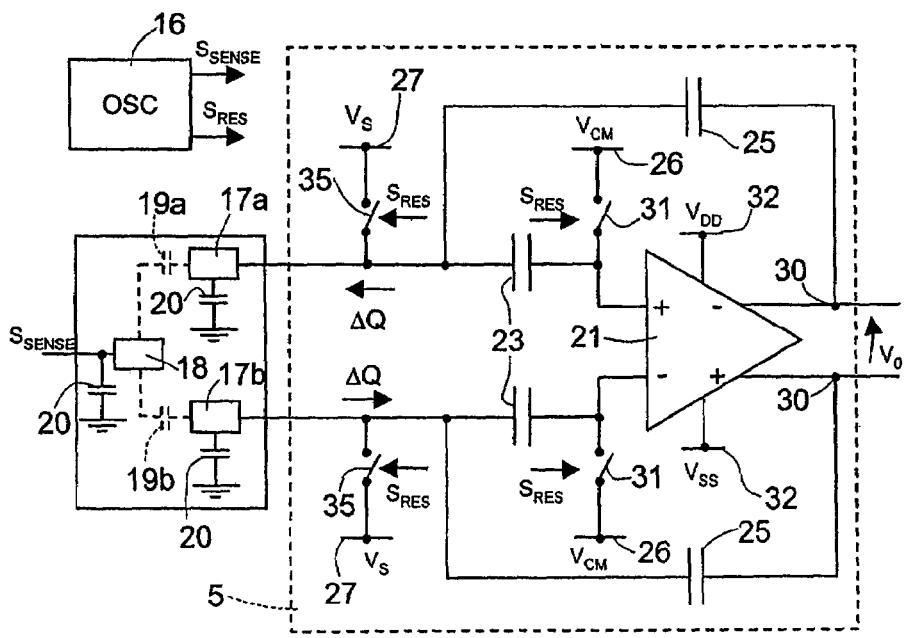

In FIG. 4, where the differential stage 5 is illustrated in detail, the microstructure 2 is represented from the electrical standpoint by the first and second stator terminals 17a, 17b, the common terminal 18, a first equivalent capacitor 19a and a second equivalent capacitor 19b, and parasitic capacitors 20. The first equivalent capacitor 19a is connected between the first stator terminal 17a and the common terminal 18 and has a variable capacitance, equal to the sum of the capacitances of all the first capacitors 15a; likewise, the second equivalent capacitor 19b is connected between the second stator terminal 17b and the common terminal 18 and has a variable capacitance, equal to the sum of the capacitances of all the second capacitors 15b. The parasitic capacitors 20 represent, instead, the parasitic capacitances associated to the stator terminals 17a, 17b and to the common terminal 18 (towards ground). Furthermore, FIGS. 4a and 4b show a local oscillator 16, which generates a reading and driving signal $S_{SENSE}$ and a reset signal $S_{RES}$, both of which are square-wave signals. The reading and driving signal $S_{SENSE}$ is supplied to the common terminal 18, whereas the reset signal $S_{RES}$ is used for clocking the differential stage 5. As illustrated in FIG. 5, the reading and driving signal $S_{SENSE}$ and the reset signal $S_{RES}$ preferably have the same period T and opposite logic values. Furthermore, the reading and driving signal $S_{SENSE}$ is at a high level for a time longer than one half-period (for example, ⅔ of the period T), and, obviously, the reset signal $S_{RES}$ is at a high level for a time shorter than one half-period (for example, ⅓ of the period T).

The differential stage 5 comprises a fully differential switched-capacitor charge amplifier, hereinafter referred to more simply as differential amplifier 21, and further includes DC decoupling capacitors 23, feedback capacitors 25, a common-mode voltage source 26, and a shift voltage source 27, here schematically represented as supply lines.

The differential amplifier 21 has two inputs 28 and two outputs 30 and is in charge-amplifier configuration.

Through respective first switches 31 actuated by the reset signal $S_{RES}$, the inputs 28 of the differential amplifier 21 are selectively connectable to the common-mode voltage source 26, which supplies a common-mode voltage $V_{CM}$. Preferably, the common-mode voltage $V_{CM}$ is the average between a maximum supply voltage $V_{DD}$ and a minimum supply voltage $V_{SS}$ supplied to the differential amplifier 21 by respective supply lines 32, 33.

The inputs of the differential amplifier 21 are moreover connected to first terminals of respective DC decoupling capacitors 23, which have second terminals connected to the first stator terminal 17a and to the second stator terminal 17b, respectively. The DC decoupling capacitors 23 are sized so as to obtain DC decoupling between the inputs 28 of the differential amplifier 21 and the stator terminals 17a, 17b of the microstructure 2. Electrical signals with non-zero frequency, in particular with a frequency around the natural frequency of resonance $\omega_R$, can instead be transmitted through the DC decoupling capacitors 23.

Figure 6:
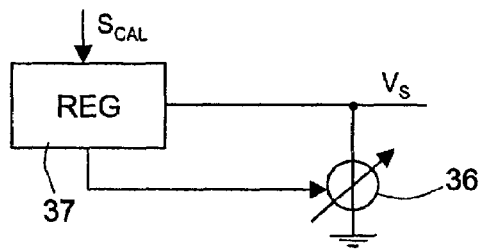
FIG. 6 is a simplified circuit diagram of a part of the device for controlling the frequency of resonance illustrated in FIG. 4.

Through respective second switches 35 actuated by the reset signal $S_{RES}$, the second terminals of the DC decoupling capacitors 23, and consequently also the first and second stator terminals 17a, 17b of the microstructure 2, are selectively connectable to the shift voltage source 27, which supplies an adjustable shift voltage $V_S$ independent of the common-mode voltage $V_{CM}$. As illustrated in FIG. 6, the shift voltage source 27 comprises a controllable voltage generator 36, which supplies the shift voltage $V_S$, and a regulator circuit 37, connected to the control unit 7 for receiving the calibration signal $S_{CAL}$. The regulator circuit 37 acts on the variable-voltage generator 36 to control the shift voltage $V_S$ according to the calibration signal $S_{CAL}$.

With reference once again to FIG. 4, the feedback capacitors 25 are each connected between a respective output 30 of the differential amplifier 21 and the second terminal of a respective DC decoupling capacitor 23.

Across the outputs 30 of the differential amplifier 21, there is an output voltage $V_O$ correlated to the displacement of the movable body 11 of the microstructure 2 with respect to the stator 10.

Operation of the device for controlling the frequency of resonance of the electromechanical resonator 1 envisages two steps which are cyclically repeated.

In a reset step (FIG. 4a), the first switches 31 and second switches 35 are in a circuit-closing condition (see also FIG. 5, which illustrates the waveform of the reset signal $S_{RES}$). Consequently, the inputs 28 of the differential amplifier 21 are connected to the common-mode voltage source 26 and are at the common-mode voltage $V_{CM}$, whereas the first and second stator terminals 17a, 17b of the microstructure 2 are connected to the shift voltage source 27 and receive the shift voltage $V_S$. In the reset step, the inputs 28 of the differential amplifier 21 and the stator terminals 17a, 17b of the microstructure 2 can be biased at voltages independent of one another thanks to the DC decoupling capacitors 23, which operate as batteries and, in the embodiment described herein, are charged at the voltage $V_S$-$V_{CM}$.

In a subsequent read step (FIG. 4b), the first switches 31 and second switches 35 are opened so as to disconnect the inputs 28 of the differential amplifier 21 and the stator terminals 17a, 17b of the microstructure 2 from the voltage sources 26, 27. In this step, the DC decoupling capacitors 23 operate as batteries and apply the shift voltage $V_S$ on the first and second stator terminal 17a, 17b. Consequently, the electromechanical resonator 1 is forced to oscillate at a translated resonance frequency $\omega_{RS}$, which is given by the value of the shift voltage $V_S$ according to Equations (5)-(7) and differs from the natural frequency of resonance $\omega_R$. Clearly, the value of the translated frequency of resonance $\omega_{RS}$ can be calibrated by acting on the second voltage source 27 by means of the calibration signal $S_{CAL}$.

In the reading step, the differential amplifier 21 reads charge packets $\Delta Q$ provided or absorbed by the stator terminals 17a, 17b and due partly to the capacitive unbalancing between the capacitances of the first and second equivalent capacitors 19a, 19b and partly to the reading and driving signal $S_{SENSE}$ applied to the common terminal 18. The charge packets $\Delta Q$ are converted by the differential amplifier 5, which generates the output voltage $V_O$, oscillating at the translated frequency of resonance $\omega_{RS}$. The DC decoupling capacitors 23 can be sized in such a way that their effect on the output voltage $V_O$ is negligible.

As emerges from the above description, the invention advantageously enables substantial exploitation of the entire dynamics made available by the minimum and maximum supply voltages of the micro-electromechanical resonator for calibrating the frequency of resonance. In particular, the constraint set by the connection between the inputs of the differential amplifier and the stator terminals of the microstructure is removed, it being thus possible for said inputs of the differential amplifier and said stator terminals of the microstructure to receive independent shift voltages. Also the frequency of resonance can hence be calibrated within a very wide range of values. Furthermore, the DC decoupling capacitors 23 enable a reduction in the output electronic noise and in the offset.

Finally, it is clear that modifications and variations may be made to the device described herein, without thereby departing from the scope of the present invention, as defined in the annexed claims.

In particular, the invention can be exploited with micro-electromechanical devices other than resonators, such as for example gyroscopes. The microstructure could, for example, be of a rotational type or with a number of translational and/or rotational degrees of freedom. Each movable electrode can be coupled to an individual fixed electrode, instead of being set between two fixed electrodes. The shift voltage can be supplied to the common terminal instead of being supplied to the stator terminals.

The invention claimed is:
1. A device, comprising:
a microstructure including a first body and a second body, said second body being capacitively coupled to said first body and elastically oscillatable with respect thereto at a calibratable frequency of resonance, wherein a relative displacement between said second body and said first body is detectable;

an amplifier coupled to said microstructure for detecting said relative displacement;

a calibration circuit coupled to said microstructure for applying an electrostatic force between said first body and said second body so as to modify said frequency of resonance; and DC decoupling elements arranged between said microstructure and said amplifier and arranged between said calibration circuit and said amplifier.

2. The device according to claim 1, wherein said microstructure comprises capacitive coupling elements arranged between said first body and said second body, and said calibration circuit comprises a shift voltage source, supplying to said capacitive coupling elements a shift voltage for modifying said frequency of resonance.

3. The device according to claim 2, wherein said DC decoupling elements are connected to inputs of said amplifier and to said capacitive coupling elements.

4. The device according to claim 3, wherein said amplifier is a fully differential amplifier.

5. The device according to claim 4, further comprising a common-mode voltage source for supplying a common-mode voltage to said amplifier.

6. The device according to claim 5, wherein said shift voltage is independent of said common-mode voltage.

7. The device according to claim 6, further comprising first switches for alternatively connecting and disconnecting said inputs of said amplifier and said common-mode voltage source, and second switches for alternatively connecting and disconnecting said capacitive-coupling elements and said shift voltage source.

8. The device according to claim 5, wherein said DC decoupling elements are connected between said shift voltage source and said common-mode voltage source.

9. The device according to claim 1, wherein said DC decoupling elements are of a capacitive type.

10. The device according claim 1, wherein said microstructure further comprises elastic connection elements for elastically connecting said first body and said second body, said elastic connection elements being shaped so as to enable oscillations of said second body with respect to said first body according to a pre-determined axis.

11. The device according to claim 10, wherein said elastic connection elements have an elastic constant and wherein said calibratable frequency of resonance is correlated to said elastic constant and to a mass of said second body.

12. An oscillating micro-electromechanical system comprising:

a microstructure including a first body and a second body, said second body capacitively coupled to said first body and elastically oscillatable with respect thereto at a calibratable frequency of resonance, wherein a relative displacement between said second body and said first body is detectable;

an amplifier coupled to said microstructure for detecting said relative displacement; and means for controlling the frequency of resonance including means for decoupling the amplifier and the microstructure.

13. The oscillating micro-electromechanical system according to claim 12, further comprising a control unit cooperating with said means for controlling the frequency of resonance.

14. The oscillating micro-electromechanical system according to claim 12, wherein the means for decoupling includes first and second capacitances, the first capacitance being coupled between a first output of the microstructure and a first input of the amplifier, and the second capacitance being coupled between a second output of the microstructure and a second input of the amplifier.

15. A method for controlling the frequency of resonance of a micro-electromechanical system comprising the steps of:

setting in oscillation a microstructure including a first body, a second body, and capacitive-coupling elements, said second body capacitively coupled to said first body and elastically oscillatable with respect thereto at a calibratable frequency of resonance;

generating a signal based on a relative displacement between said second body and said first body;

amplifying said signal using an amplifier;

DC decoupling said amplifier from said microstructure;

supplying a common-mode voltage to said amplifier using a common-mode voltage source;

alternatively connecting and disconnecting inputs of said amplifier and said common-mode voltage source; and alternatively connecting and disconnecting said capacitive-coupling elements and a shift voltage source of a calibration circuit, the calibration circuit coupled to said microstructure for applying an electrostatic force between said first body and said second body so as to modify said frequency of resonance.

16. The method of claim 15, further comprising the step of applying a DC shift voltage to the microstructure to adjust the frequency of resonance.

17. The method of claim 16, further comprising filtering DC components from said signal by filtering the DC shift voltage from said signal.

18. A MEMS system having a controllable resonance frequency, comprising:

a microstructure for generating a signal at a resonance frequency, the microstructure including
a stator having a plurality of fixed electrodes, and
a moveable body oscillatably coupled to the stator via mechanical elements and having a plurality of movable electrodes capacitively coupled to the plurality of fixed electrodes;

a shift voltage source electrically coupled to the plurality of fixed electrodes for adjusting the resonance frequency;

an amplifier having an input electrically coupled to the plurality of fixed electrodes for receiving the signal at the resonance frequency;

a DC decoupling capacitor having a first terminal and a second terminal, the first terminal being coupled to the amplifier input and the second terminal being coupled to the shift voltage source; and a common-mode voltage source coupled to the amplifier input and the first terminal of the at least one DC decoupling capacitor.

19. The MEMS system of claim 18, wherein the amplifier is a differential amplifier.

20. The MEMS system of claim 18, wherein the mechanical elements are springs.

21. The MEMS system of claim 18, further comprising a control unit coupled to the shift voltage source for controlling the shift voltage source.

22. A device, comprising:

a microstructure including a first body, a second body, and capacitive coupling elements, said second body being capacitively coupled to said first body and elastically oscillatable with respect thereto at a calibratable frequency of resonance, wherein a relative displacement between said second body and said first body is detectable;

an amplifier coupled to said microstructure for detecting said relative displacement;

a calibration circuit comprising a shift voltage source;

DC decoupling elements arranged between said microstructure and said amplifier, said DC decoupling elements connected to inputs of said amplifier and to said capacitive coupling elements;

a common-mode voltage source for supplying a common-mode voltage to said amplifier; and first switches for alternatively connecting and disconnecting inputs of said amplifier and said common-mode voltage source, and second switches for alternatively connecting and disconnecting said capacitive-coupling elements and said shift voltage source.

23. The device according to claim 22, wherein said calibration circuit is coupled to said microstructure for applying an electrostatic force between said first body and said second body so as to modify said frequency of resonance.

24. The device according to claim 23, wherein said capacitive coupling elements are arranged between said first body and said second body, and said shift voltage source supplies to said capacitive coupling elements a shift voltage for modifying said frequency of resonance.

25. The device according to claim 24, wherein said DC decoupling elements are connected to inputs of said amplifier and to said capacitive coupling elements.

26. The device according to claim 25, wherein said amplifier is a fully differential amplifier.

27. The device according to claim 26, further comprising a common-mode voltage source for supplying a common-mode voltage to said amplifier.

28. The device according to claim 27, wherein said shift voltage is independent of said common-mode voltage.

* * * * *